(12) United States Patent
Aoyama et al.

(10) Patent No.: US 12,193,146 B2
(45) Date of Patent: Jan. 7, 2025

(54) HEATER INCLUDING FLEXIBLE PRINTED WIRING BOARD AND METHOD FOR MANUFACTURING SAME

(71) Applicant: MEKTEC CORPORATION, Tokyo (JP)

(72) Inventors: Shunsuke Aoyama, Tokyo (JP); Kenji Kiya, Tokyo (JP)

(73) Assignee: MEKTEC CORPORATION, Tokyo (JP)

( * ) Notice: Subject to any disclaimer, the term of this patent is extended or adjusted under 35 U.S.C. 154(b) by 927 days.

(21) Appl. No.: 17/170,265

(22) Filed: Feb. 8, 2021

(65) Prior Publication Data
US 2021/0307155 A1 Sep. 30, 2021

(30) Foreign Application Priority Data
Mar. 26, 2020 (JP) ................. 2020-056295

(51) Int. Cl.
| | |
|---|---|
| H05K 1/02 | (2006.01) |
| H05K 1/03 | (2006.01) |
| H05K 3/36 | (2006.01) |
| H05B 1/02 | (2006.01) |
| H05B 3/84 | (2006.01) |

(52) U.S. Cl.
CPC ......... *H05K 1/0212* (2013.01); *H05K 1/0393* (2013.01); *H05K 3/363* (2013.01); *H05B 1/0236* (2013.01); *H05B 3/84* (2013.01)

(58) Field of Classification Search
CPC .... H05K 1/0212; H05K 1/0393; H05K 1/167; H05K 1/181; H05K 1/189; H05K 3/363; H05K 2201/09263; H05B 1/0236; H05B 3/84; H05B 3/06; H05B 3/34; H05B 3/02
See application file for complete search history.

(56) References Cited

U.S. PATENT DOCUMENTS

| | | | | |
|---|---|---|---|---|
| 4,751,146 A | * | 6/1988 | Maeda ................ | H05K 1/036 428/209 |
| 2017/0003440 A1 | | 1/2017 | Kim et al. | |
| 2017/0070651 A1 | | 3/2017 | Hacker et al. | |

FOREIGN PATENT DOCUMENTS

| | | |
|---|---|---|
| CN | 205195987 U | 4/2016 |
| CN | 114567966 A * | 5/2022 |
| DE | 102010052472 A1 | 5/2012 |
| JP | H05-064624 A | 3/1993 |
| JP | 2001-310709 A | 11/2001 |
| JP | 5038921 B2 | 10/2012 |

(Continued)

OTHER PUBLICATIONS

An Office Action; "Notice of Reasons for Refusal," mailed by the Japanese Patent Office on Sep. 5, 2023, which corresponds to Japanese Patent Application No. 2020-056295 and is related to U.S. Appl. No. 17/170,265; with English language translation.

(Continued)

*Primary Examiner* — Shawntina T Fuqua
(74) *Attorney, Agent, or Firm* — Studebaker & Brackett PC

(57) ABSTRACT

A heater includes: a flexible printed wiring board including a base film and a metal foil provided on one side of the base film; a heater circuit portion that is formed from the metal foil and generates heat when energized; and a heat conductive foil portion that is formed from the metal foil at a position away from the heater circuit portion and is maintained in a non-energized state.

14 Claims, 8 Drawing Sheets

(56) References Cited

FOREIGN PATENT DOCUMENTS

| JP | 2015-039507 A | | 3/2015 |
|---|---|---|---|
| JP | 2018532250 A | * | 11/2018 |

OTHER PUBLICATIONS

An Office Action mailed by the State Intellectual Property Office of the People's Republic of China on Oct. 25, 2024, which corresponds to Chinese Patent Application No. 202110168668.7 and is related to U.S. Appl. No. 17/170,265; with English language translation.

* cited by examiner

HEATER INCLUDING FLEXIBLE PRINTED WIRING BOARD AND METHOD FOR MANUFACTURING SAME

CROSS-REFERENCE TO RELATED APPLICATION

This application claims priority from Japanese Patent Application No. 2020-056295 filed with the Japan Patent Office on Mar. 26, 2020, the entire content of which is hereby incorporated by reference.

BACKGROUND

1. Technical Field

One aspect of the present disclosure relates to a heater including a flexible printed wiring board and a method for manufacturing the same.

2. Related Art

Conventionally, a film-like heater has been used to heat a windshield of an automobile, or the like. In recent years, development of advanced driver assistance systems (ADAS) has progressed. There is an increasing need for the film-like heater to prevent fogging of a camera lens for detection and the windshield. Hereinafter, the film-like heater and the method for manufacturing the same will be described with reference to FIGS. 7A to 7C and FIGS. 8A to 8C. FIGS. 7A to 7C and FIGS. 8A to 8C are manufacturing process diagrams of the film-like heater according to a conventional example.

First, a heater wire 510 is formed using a material that generates heat when energized (see FIG. 7A). As materials of the heater wire 510, alloys and pure metals are used, such as nickel-chromium alloys, SUS, aluminum, platinum, iron, and nickel. Next, a first insulating film 521 and a second insulating film 522 are respectively provided on two surfaces of the heater wire 510. The first insulating film 521 and the second insulating film 522 sandwich the heater wire 510, and are bonded by a pressure-sensitive adhesive layer 523 provided between the films (see FIG. 7B). Thereafter, a soaking plate 531 for making distribution of heating temperature uniform is bonded to a surface of the second insulating film 522 by a pressure-sensitive adhesive layer 532 (see FIG. 7C). FIG. 7A is a plan view of the heater wire 510. FIGS. 7B and 7C illustrate an intermediate product formed in a process of manufacturing the heater by schematic cross-sectional views.

Next, an electronic component 530 is attached to a front surface side of the first insulating film 521 in a state where it can be electrically connected to the heater wire 510 (see FIG. 8A). An illustrated example shows a case where only one electronic component 530 is attached thereto. A plurality of electronic components may be attached thereto. As an example of the electronic component 530, a thermal fuse can be mentioned. Thereafter, a wire harness 540 is attached to the heater wire 510, in a state where it can be electrically connected to the heater wire 510, by various methods such as a rivet method or soldering (see FIG. 8B). Then, a connector 550 is attached to an end of the wire harness 540, in a state where it can be electrically connected to the end, via a crimp pin (not shown). The connector 550 is connected to a power source for energizing the heater wire 510 and an apparatus including a control device for controlling temperature. The heater 500 is obtained by the above manufacturing process. FIGS. 8A and 8B are plan views of the intermediate product formed in the process of manufacturing the heater. FIG. 8C is a plan view of the heater 500 that is a finished product.

The method for manufacturing the heater 500 obtained by the above manufacturing process requires a step of bonding the soaking plate 531 and a step of attaching the wire harness 540, and the number of manufacturing steps is large. The pressure-sensitive adhesive layer 523, the second insulating film 522, and the pressure-sensitive adhesive layer 532 are interposed between the heater wire 510 and the soaking plate 531. Therefore, thermal conductivity between the heater wire 510 and the soaking plate 531 is low. Further, there is a possibility that the soaking plate 531 lacks reliability in the degree of bonding to the second insulating film 522.

Examples of the prior art documents include Japanese Patent No. 5038921, JP-UM-A-05-064624, and German Patent Application Publication No. 102010052472.

SUMMARY

A heater includes: a flexible printed wiring board including a base film and a metal foil provided on one side of the base film; a heater circuit portion that is formed from the metal foil and generates heat when energized; and a heat conductive foil portion that is formed from the metal foil at a position away from the heater circuit portion and is maintained in a non-energized state.

DETAILED DESCRIPTION

Figure 1A:
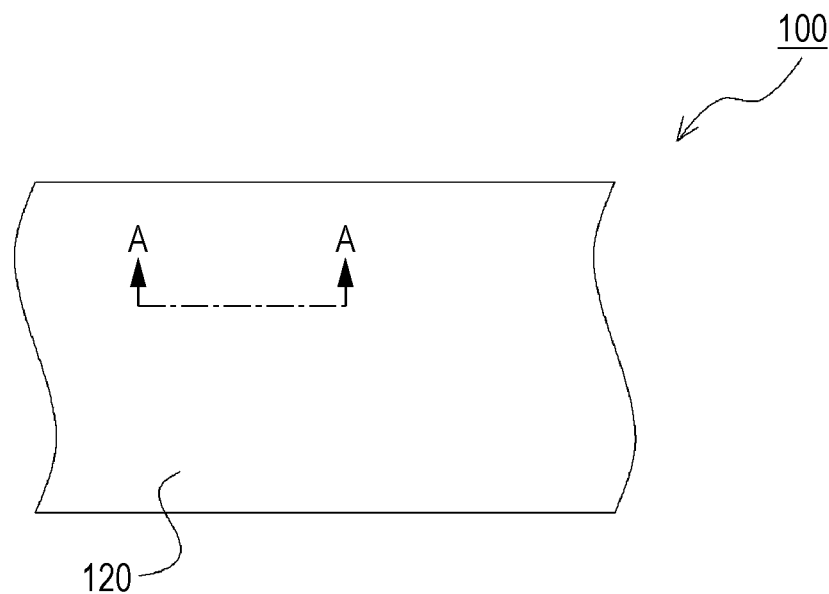
FIGS. 1A and 1B are manufacturing process diagrams of a heater using a flexible printed wiring board according to Example 1 of the present disclosure.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

An object of the present disclosure is to provide a heater including a flexible printed wiring board capable of reducing the number of manufacturing steps, and a method for manufacturing the same.

In an aspect of the present disclosure, the following configuration is employed to solve the above problems.

That is, a heater according to an aspect of the present disclosure includes: a flexible printed wiring board including a base film and a metal foil provided on one side of the base film; a heater circuit portion that is formed from the metal foil and generates heat when energized; and a heat conductive foil portion that is formed from the metal foil at a position away from the heater circuit portion and is maintained in a non-energized state.

According to the above aspect, the heat conductive foil portion is formed from the metal foil. Therefore, a separate step of attaching a member for heat conduction such as a soaking plate is not necessary. Further, the heater circuit portion and the heat conductive foil portion is provided on the one side of the base film. Therefore, thermal conductivity from the heater circuit portion to the heat conductive foil portion can be increased.

Further, a heater according to another aspect of the present disclosure includes: a flexible printed wiring board including a base film and a metal foil provided on one side of the base film; a heater circuit portion including a heater wire formed from the metal foil; and a connecting portion that is formed from the metal foil and short-circuits adjacent portions of the heater wire. The heater circuit portion includes: a heat generating portion with a large amount of heat generated by energization; and a heat conductive foil portion with a small amount of heat generated by energization but exhibiting a heat transfer function.

Also in this aspect, the heater circuit portion having the heat generating portion and the heat conductive foil portion is formed from the metal foil. Therefore, the separate step of attaching the member for heat conduction such as the soaking plate is not necessary. Further, the heat generating portion and the heat conductive foil portion is provided on the one side of the base film. Therefore, the thermal conductivity from the heat generating portion to the heat conductive foil portion can be increased.

The heater circuit portion may include a heater wire that meanders at equal intervals and has a constant line width.

Further, the heater according to the embodiment further may include an energizing portion that is formed from the metal foil and energizes the heater circuit portion.

This also eliminates a conventional step of attaching a wire harness.

Further, the heater according the embodiment further may include: a cover film that covers a surface of the metal foil; at least one electronic component provided on a front surface side of the cover film in a state where it can be electrically connected to the metal foil; and a connector provided in a state where it can be electrically connected to the energizing portion.

Moreover, a method for manufacturing a heater including a flexible printed wiring board according to an aspect of the present disclosure includes: forming from a part of a metal foil a heater circuit portion that generates heat when energized and a heat conductive foil portion that is maintained in a non-energized state, by etching a material including a base film and the metal foil provided on one side of the base film; and providing a cover film covering a surface of the metal foil after the etching.

According to the above aspect, the heater circuit portion and the heat conductive foil portion are formed by the etching step. Therefore, the number of manufacturing steps can be reduced.

Further, a method for manufacturing a heater including a flexible printed wiring board according to an aspect of the present disclosure includes: forming from a part of a metal foil a heater circuit portion including a heater wire and a connecting portion that short-circuits adjacent portions of the heater wire, by etching a material including a base film and the metal foil provided on one side of the base film; and providing a cover film covering a surface of the metal foil after the etching.

According to the above aspect, the heater circuit portion and the connecting portion are formed by the etching step. Therefore, the number of manufacturing steps can be reduced.

The etching may include forming an energizing portion for energizing the heater circuit portion from a part of the metal foil.

Thus, the energizing portion can also be formed by the etching step. Therefore, the number of manufacturing steps can be further reduced.

The method for manufacturing the heater including the flexible printed wiring board according to the aspect may further include, after providing the cover film, providing by reflow soldering at least one electronic component provided on a front surface side of the cover film in a state where it can be electrically connected to the metal foil and a connector provided in a state where it can be electrically connected to the energizing portion.

Thus, the electronic component and the connector can be attached in the reflow step. Therefore, the number of manufacturing steps can be further reduced.

Note that the above configurations can be used in combination as much as possible.

As described above, according to the aspect of the present disclosure, the number of manufacturing steps can be reduced.

A configuration for performing a technique of the present disclosure will be exemplarily described in detail based on examples with reference to the drawings below. However, dimensions, materials, shapes, relative arrangements, and the like of components described in this example are not intended to limit the technical scope of the present disclosure to them unless otherwise specified.

EXAMPLES

The heater including the flexible printed wiring board and the method for manufacturing the same according to Example 1 of the present disclosure will be described with reference to FIGS. 1A to 5B. FIGS. 1A to 5B are manufacturing process diagrams of the heater including the flexible printed wiring board according to Example 1 of the present disclosure. Note that a heater 10 according to this example can be suitably used for heating a camera lens for detection and a windshield. Further, the heater 10 according to this example is not a heater only to heat various members constituting an automobile but can also be applied to various devices other than the automobile. The heater 10 according to this example has flexibility and can be bent in various directions. Therefore, the heater 10 can be attached to a curved portion along its curved surface and can be used attached in this way.

<Heater>

Figure 5A:
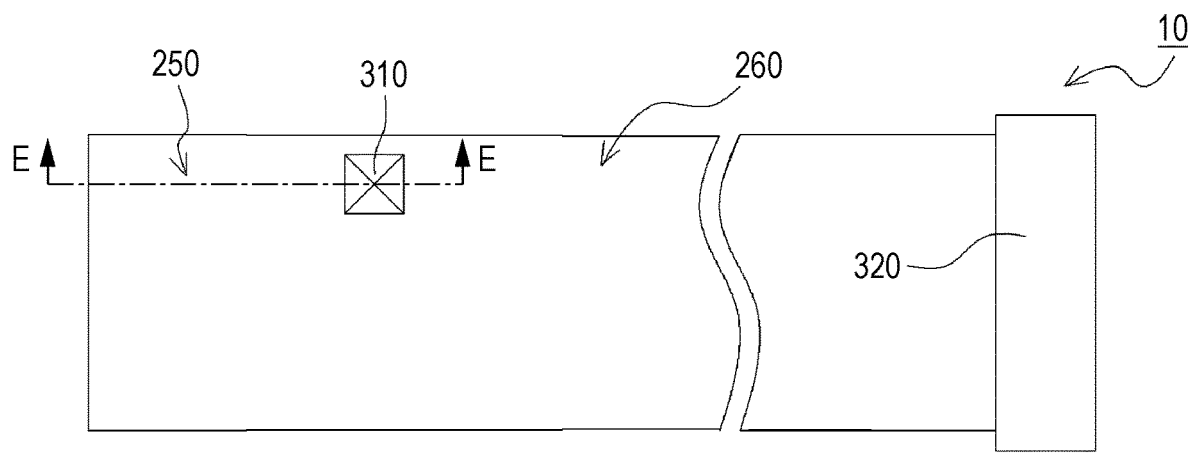
FIGS. 5A and 5B are manufacturing process diagrams of the heater using the flexible printed wiring board according to Example 1 of the present disclosure.
Figure 5B:
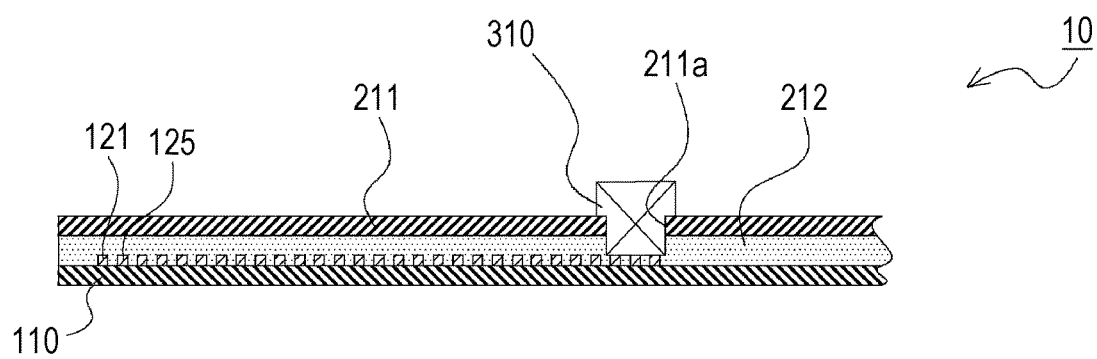

Particularly with reference to FIGS. 5A and 5B, a configuration of the heater including the flexible printed wiring board according to this example will be described. FIGS. 5A and 5B illustrate the heater 10 that is a finished product. Note that FIG. 5A is a plan view of the heater 10. FIG. 5B is a schematic cross-sectional view (corresponding to an E-E cross-sectional view in FIG. 5A) of the heater 10.

The heater 10 according to this example mainly includes a heating portion 250 for heating a heating target portion, an electric wiring portion 260, an electronic component 310 provided in the heating portion 250, and a connector 320 provided on an end of the electric wiring portion 260. An illustrated example shows one electronic component 310. A plurality of electronic components may be provided depending on an application of the heater 10. Specific examples of the electronic component 310 include a thermistor for temperature control, chip components such as a PTC element, and a thermal fuse. Further, the connector 320 is provided to be connected to a power source for energizing a heater circuit portion 121 and an apparatus (not shown) including a control device for controlling temperature.

Next, internal configurations of the heating portion 250 and the electric wiring portion 260 in the heater 10 will be described. The heater 10 according to this example includes a base film 110, and a heater circuit portion 121 that generates heat when energized, energizing portions 122 and 123, and heat conductive foil portions 125 and 126, which are provided on one surface of the base film 110 (see FIGS. 2A and 2B). That is, the heater 10 further includes the energizing portions 122 and 123 formed from a metal foil 120 for energizing the heater circuit portion 121. The heater circuit portion 121 is configured to generate heat when energized by electric power from the apparatus (not shown) connected to the connector 320, which is supplied via the energizing portions 122 and 123.

A plurality of heat conductive foil portions 125 and 126 are provided so that the non-energized state is maintained. The heat conductive foil portions 125 and 126 are formed at positions away from the heater circuit portion 121, so as not to be energized by the electric power supplied through the energizing portions 122 and 123. That is, the heat conductive foil portions 125 and 126 are configured to exhibit a heat transfer function even though they are not energized. Thus, the heater circuit portion 121 generates heat, so that the heat is also transferred to the heat conductive foil portions 125 and 126. As a result, an entire region where the heater circuit portion 121 and the heat conductive foil portions 125 and 126 are provided is uniformly heated. Note that the heating portion 250 corresponds to a region portion in which the heater circuit portion 121 and the heat conductive foil portions 125 and 126 are provided. Further, the above-mentioned electric wiring portion 260 corresponds to a region portion in which the energizing portions 122 and 123 are provided.

Then, the heater 10 also includes a cover film 211. The cover film 211 covers a surface of the metal foil 120, that is, surfaces of the heater circuit portion 121, the energizing portions 122 and 123, and the heat conductive foil portions 125 and 126. The cover film 211 is attached to the base film 110 by a pressure-sensitive adhesive layer 212 so as to sandwich the heater circuit portion 121, the energizing portions 122 and 123, and the heat conductive foil portions 125 and 126. The cover film 211 is provided with openings 211a and 211b for exposing a part of the heater circuit portion 121 and parts of the energizing portions 122 and 123. Then, the electronic component 310 is provided on a front surface side of the cover film 211 in a state where it can be electrically connected to the heater circuit portion 121. The electronic component 310 is connected to a portion of the heater circuit portion 121 exposed by the opening 211a. Further, the connector 320 described above is also provided in a state where it can be electrically connected to the energizing portions 122 and 123. The connector 320 is also connected to portions of the energizing portions 122 and 123 exposed by the openings 211b.

<Method for Manufacturing Heater Including Flexible Printed Wiring Board>

The method for manufacturing the heater including the flexible printed wiring board will be described in the order of manufacturing steps.

<<Material>>

Figure 1B:
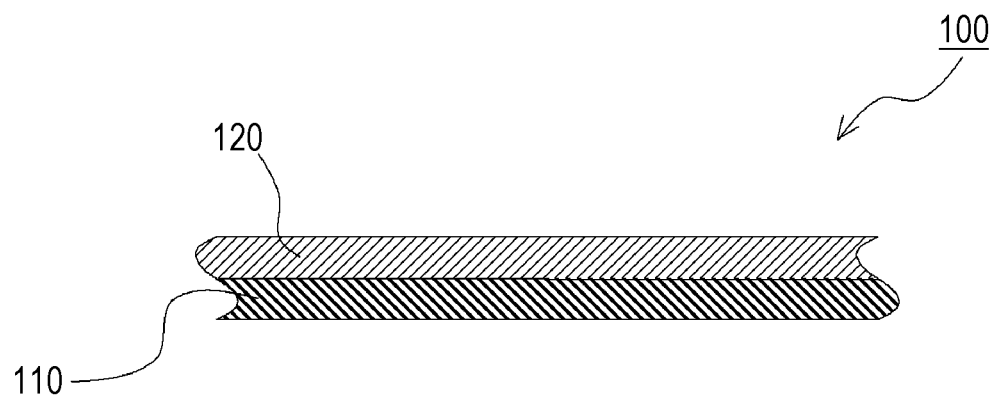

FIGS. 1A and 1B illustrate a material 100 used for manufacturing the heater 10 according to this example. FIG. 1A is a plan view illustrating a part of the material 100. FIG. 1B is a schematic cross-sectional view (an A-A cross-sectional view in FIG. 1A) of the material 100.

The material 100 is generally called a copper-clad laminate and is commercially available. The material 100 is configured to include the base film 110 and the metal foil 120 provided on one side of the base film 110. The base film 110 is made of an insulating and flexible resin material (for example, polyimide or polyethylene naphthalate). Further, the metal foil 120 is made of a copper foil. The material 100 configured in this way has flexibility and can be bent in various directions.

<<Etching Step>>

Figure 2A:
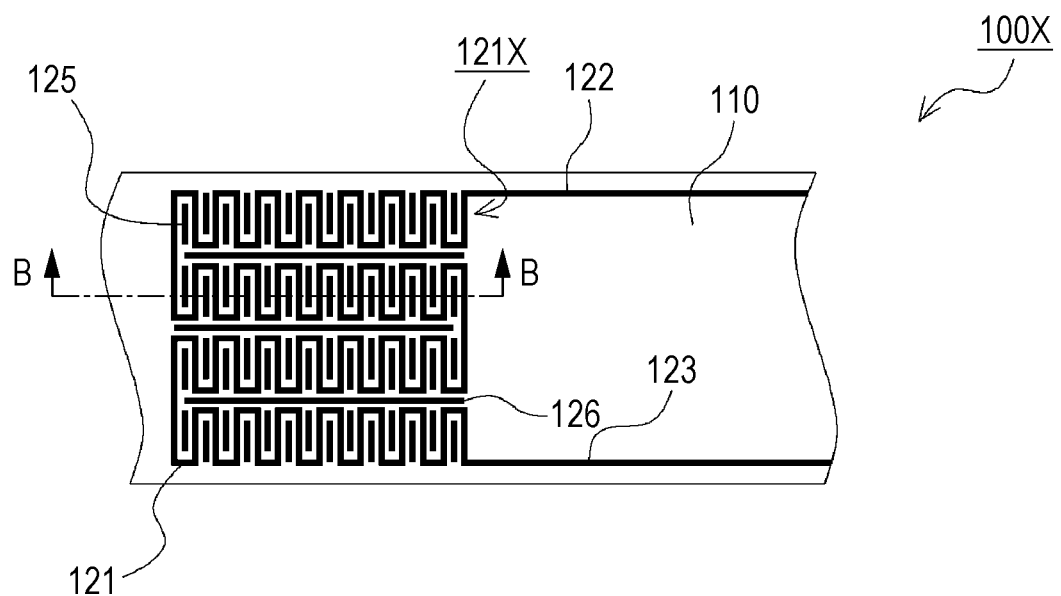
FIGS. 2A and 2B are manufacturing process diagrams of the heater using the flexible printed wiring board according to Example 1 of the present disclosure.
Figure 2B:
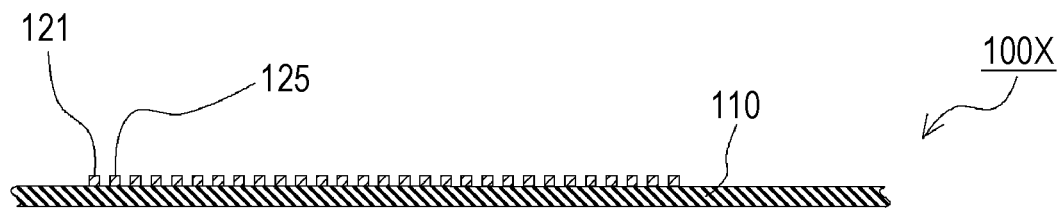

A resist pattern (portion to be a mask) for forming the heater circuit portion 121, the energizing portions 122 and 123, and the heat conductive foil portions 125 and 126 are formed on one side of the material 100 using a technique such as photolithography. Thereafter, unnecessary copper foil is removed by etching, and the heater circuit portion 121, the energizing portions 122 and 123, and the heat conductive foil portions 125 and 126 are formed. That is, the heater circuit portion 121, the energizing portions 122 and 123, and the heat conductive foil portions 125 and 126 are formed from a part of the metal foil 120. Note that, the heater circuit portion 121, the energizing portions 122 and 123, and the heat conductive foil portions 125 and 126 are formed at substantially the same time by etching. FIGS. 2A and 2B illustrate a first intermediate product 100X formed in the steps up to the etching step. FIG. 2A is a plan view of the first intermediate product 100X. FIG. 2B is a cross-sectional view (B-B cross-sectional view in FIG. 2A) of the first intermediate product 100X.

In this example, the heater circuit portion 121 formed from the metal foil 120 includes a heater wire. The heater wire in the heater circuit portion 121 is provided to have a constant wire width. Further, the heater circuit portion 121 includes the heater wire having a constant wire width that meanders at equal intervals. That is, the heater circuit portion 121 is configured to be provided with a region (meandering region 121X) in which at least one row of heater wire meanders at equal intervals (see FIG. 2A). Note that in this example, four rows of meandering regions 121X are provided. However, needless to say, a pattern of the heater circuit portion 121 is not limited to an illustrated example. Note that a method for forming the resist pattern is not limited to photolithography, and various known techniques can be employed.

<<Laminating Step>>

After the etching step, the cover film 211 is provided which covers the surface of the metal foil 120 (corresponding to the heater circuit portion 121, the energizing portions 122 and 123, and the heat conductive foil portions 125 and 126). The cover film 211 is attached to the base film 110 by the pressure-sensitive adhesive layer 212 so as to sandwich the heater circuit portion 121, the energizing portions 122 and 123, and the heat conductive foil portions 125 and 126. Like the base film 110, the cover film 211 is also made of the insulating and flexible resin material. As described above, the cover film 211 is provided with the openings 211*a* and 211*b*.

Figure 3A:
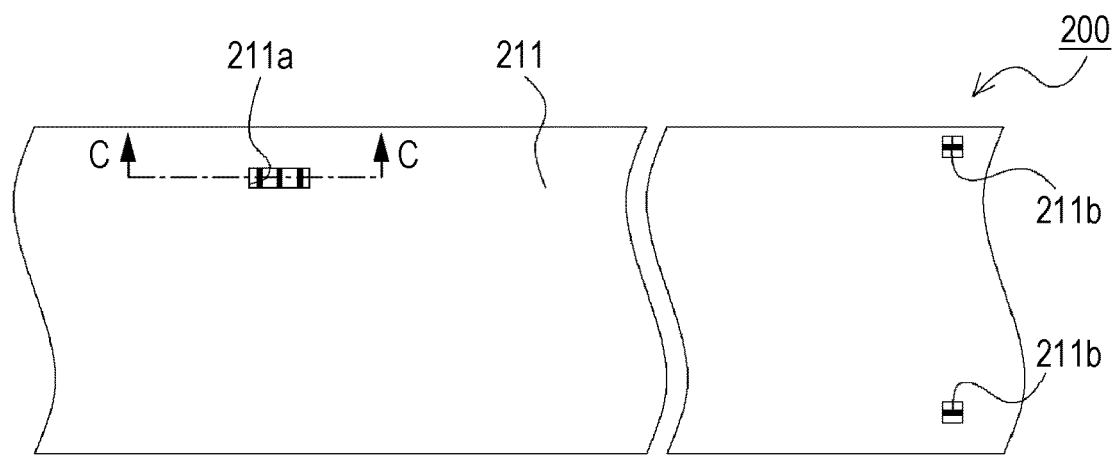
FIGS. 3A and 3B are manufacturing process diagrams of the heater using the flexible printed wiring board according to Example 1 of the present disclosure.
Figure 3B:
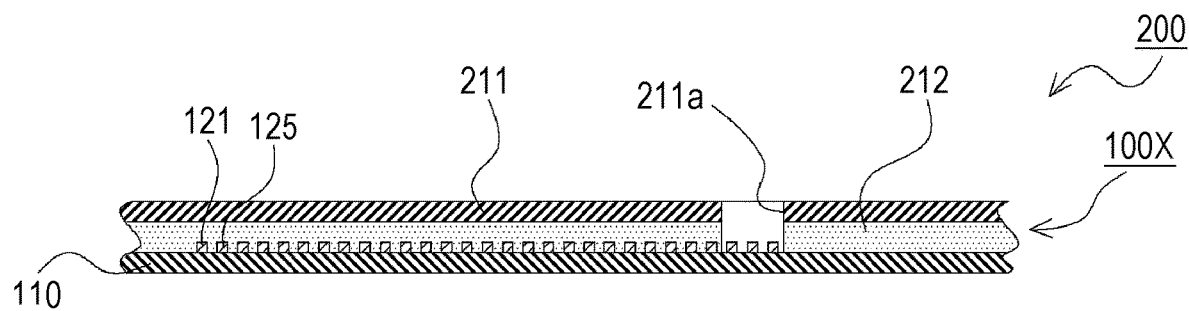

FIGS. 3A and 3B illustrate a second intermediate product 200 formed in the steps up to the laminating step. FIG. 3A is a plan view of the second intermediate product 200. FIG. 3B is a cross-sectional view (C-C cross-sectional view in FIG. 3A) of the second intermediate product 200. Various known techniques can be employed as a laminating method for providing the first cover film 211, and thus description thereof will be omitted. Note that the second intermediate product 200 corresponds to the flexible printed wiring board including the base film 110 and the metal foil 120 provided on the one side of the base film 110.

<<Reflow Step (Attaching Step)>>

Figure 4A:
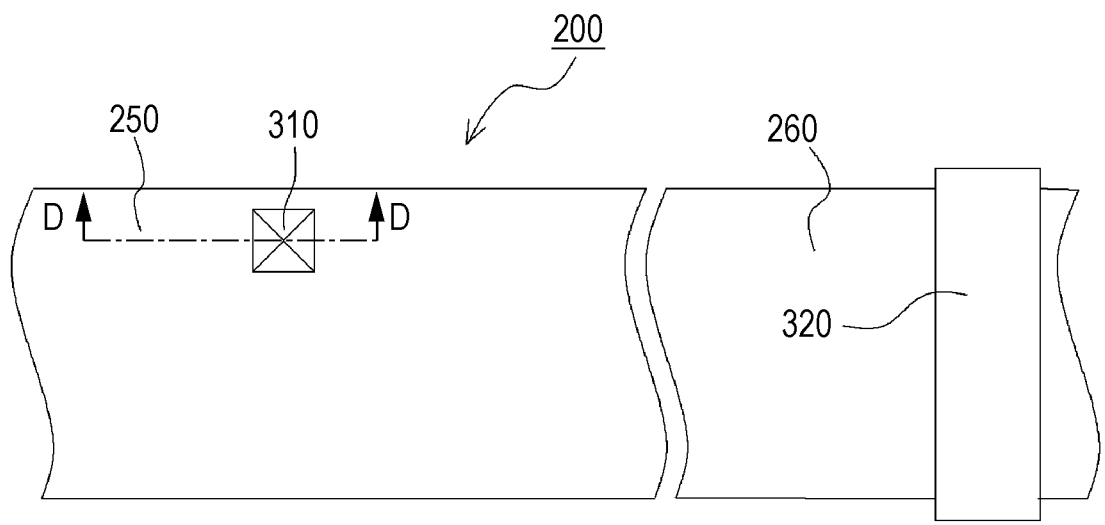
FIGS. 4A and 4B are manufacturing process diagrams of the heater using the flexible printed wiring board according to Example 1 of the present disclosure.
Figure 4B:
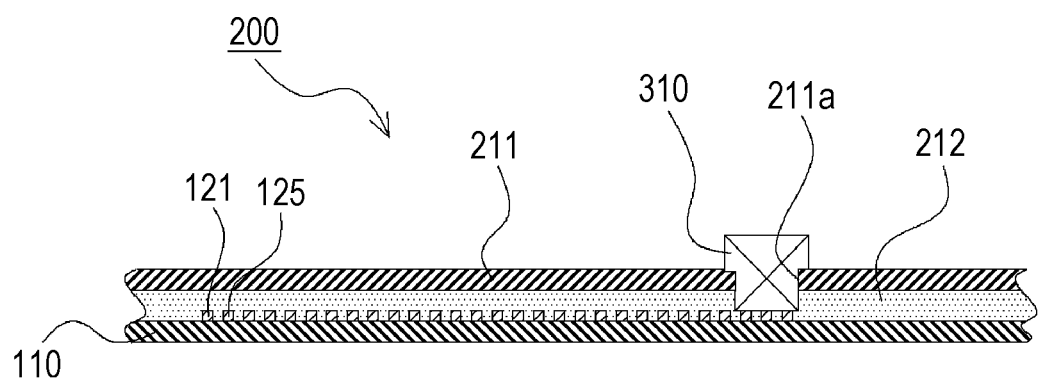

After the cover film 211 is provided, that is, after the laminating step, the electronic component 310 and the connector 320 are attached to the flexible printed wiring board which is the second intermediate product 200 by reflow soldering. First, a portion where the metal foil 120 (corresponding to the heater circuit portion 121 and the energizing portions 122 and 123) is exposed through the openings 211*a* and 211*b* is subjected to surface treatment such as gold plating or water-soluble preflux treatment. Thereafter, various components are attached thereto by soldering in a reflow furnace. That is, in this example, by reflow soldering, the electronic component 310 is connected to the heater circuit portion 121 through the opening 211*a*, and the connector 320 is connected to the energizing portions 122 and 123 through the opening 211*b*. Therefore, attachment of the electronic component 310 and attachment of the connector 320 can be performed at substantially the same time in one step. FIGS. 4A and 4B illustrate the second intermediate product 200 formed in the steps up to the reflow step. FIG. 4A is a plan view of the second intermediate product 200. FIG. 4B is a cross-sectional view (D-D cross-sectional view in FIG. 4A) of the second intermediate product 200.

<<Cutting Step>>

After the reflow step, the second intermediate product 200 is cut so as to be punched out its outer shape, and thus the heater 10 which is the finished product as illustrated in FIGS. 5A and 5B described above can be obtained. Note that a plurality of heaters 10 can be manufactured from one material 100.

<Advantages of Heater Including Flexible Printed Wiring Board and Method for Manufacturing the Same According to this Example>

According to the heater 10 including the flexible printed wiring board and the method for manufacturing the same according to this example, the heat conductive foil portions 125 and 126 are formed from the metal foil 120. Therefore, the separate step of attaching the member for heat conduction such as the soaking plate is not necessary. That is, the heater circuit portion 121 and the heat conductive foil portions 125 and 126 can be formed at substantially the same time by the etching step. Thus, the number of manufacturing steps can be reduced. Further, the heater circuit portion 121 and the heat conductive foil portions 125 and 126 are formed on the one side of the base film 110. Therefore, the thermal conductivity from the heater circuit portion 121 to the heat conductive foil portions 125 and 126 can be increased. Further, the heat conductive foil portions 125 and 126 are formed from the metal foil 120 that is previously attached to the base film 110 as a part of the material 100. Therefore, there is little possibility that the heat conductive foil portions 125 and 126 are peeled off from the base film 110.

The energizing portions 122 and 123 for energizing the heater circuit portion 121 are formed from the metal foil 120. That is, the heater circuit portion 121 and the energizing portions 122 and 123 are formed at substantially the same time by the etching step. Therefore, the step of attaching the wire harness as in a conventional case is not necessary. Therefore, the number of components can be reduced and the number of manufacturing steps can be reduced.

Further, in this example, the electronic component 310 and the connector 320 can be attached in the reflow step. Therefore, the number of manufacturing steps can be further reduced. Note that in the configuration shown in this example, the plurality of heat conductive foil portions 125 and 126 are arranged over an entire region of the heating portion 250 so that overall temperature distribution of the heating portion 250 is uniform. In this regard, the temperature distribution of the heating portion 250 can be controlled by changing an arrangement pattern of the plurality of heat conductive foil portions 125 and 126. Therefore, when the heating temperature required depending on the usage environment varies depending on a portion of the heating portion 250, the arrangement pattern of the plurality of heat conductive foil portions 125 and 126 may be appropriately changed.

Example 2

FIGS. 6A and 6B illustrate Example 2 of the present disclosure. In this example, a configuration of the heater circuit portion is different from that in Example 1. Other configurations and actions are the same as in Example 1. The same components are denoted by the same reference numerals, and description thereof will be omitted.

Figure 6:
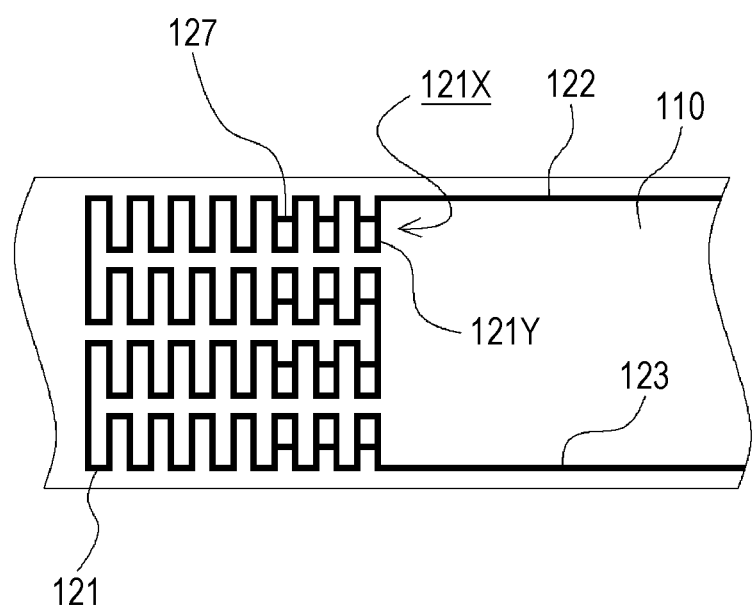
FIG. 6 is a plan view illustrating a heater circuit portion according to Example 2 of the present disclosure.
Figure 7A:
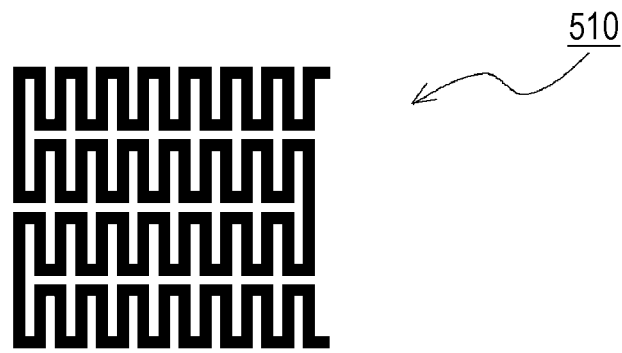
FIGS. 7A to 7C are manufacturing process diagrams of a film-like heater according to a conventional example.
Figure 7B:
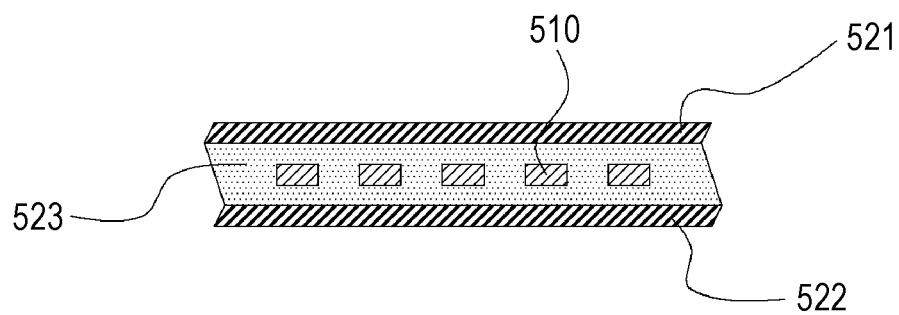
Figure 7C:
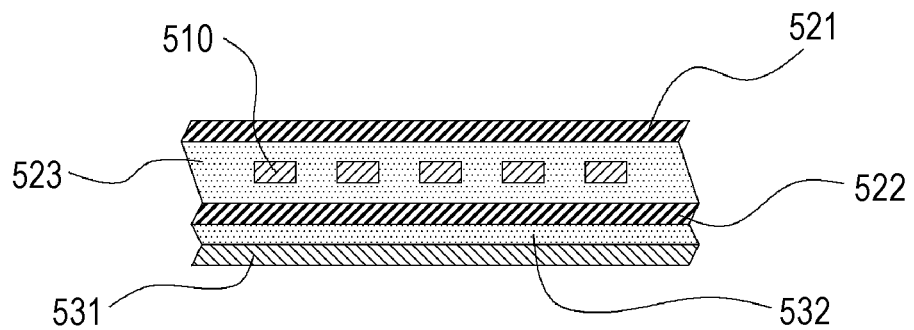
Figure 8A:
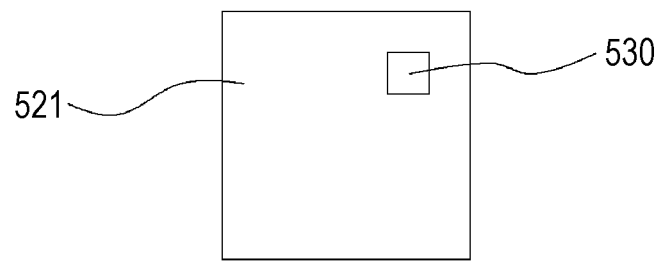
FIGS. 8A to 8C are manufacturing process diagrams of the film-like heater according to the conventional example.
Figure 8B:
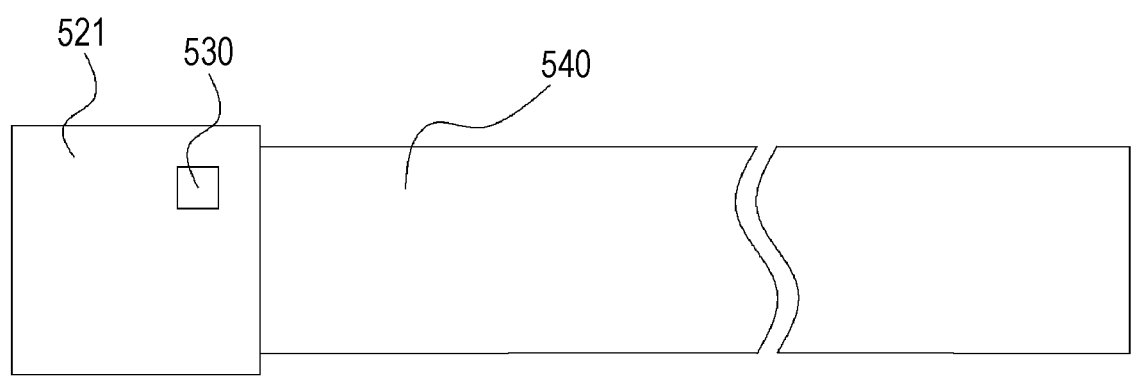
Figure 8C:
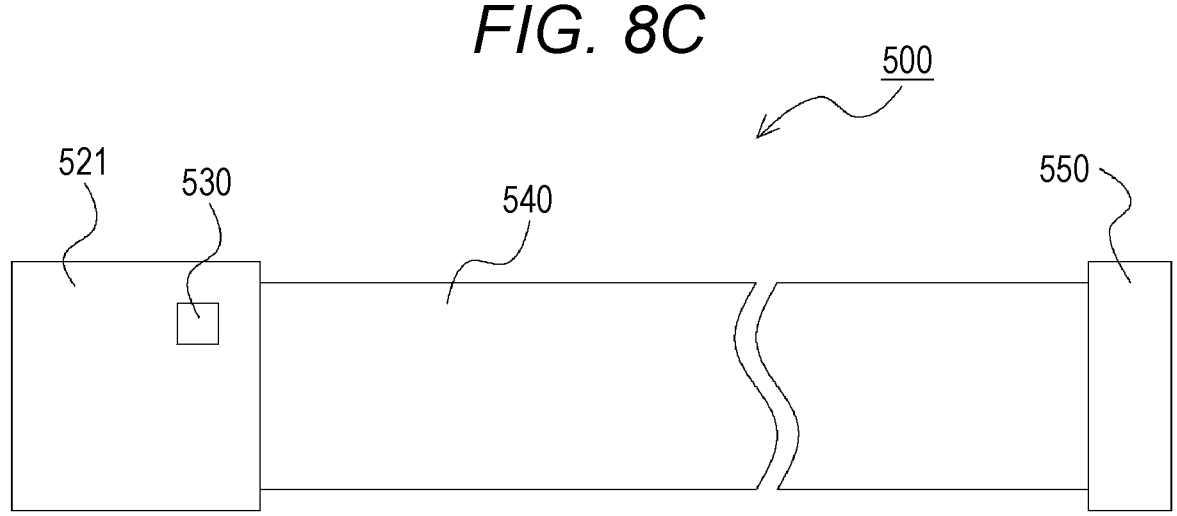

FIG. 6 is a plan view illustrating the heater circuit portion according to Example 2 of the present disclosure. Note that FIG. 6 illustrates the first intermediate product (the product after the etching step) for convenience of explanation. In the configuration employed in this example, connecting portions 127 that respectively short-circuit a plurality of adjacent portions of the heater wire are provided in the meandering region 121X of the heater circuit portion 121.

The connecting portions 127 that short-circuit the adjacent portions of the heater wire are formed from a part of the metal foil 120 together with the heater circuit portion 121 by etching the material 100 in the etching step. Thus, the heater circuit portion 121 is provided with a heat generating portion with a large amount of heat generated by energization and a heat conductive foil portion 121Y with a small amount of heat generated by energization but exhibiting a heat transfer function. The heat conductive foil portion 121Y is, for example, a portion including the connecting portion 127 in the meandering region 121X of the heater circuit portion 121.

Although a small amount of current flows through the heat conductive foil portion 121Y, almost no heat is generated by energization. Further, the portion of the heater circuit portion 121 excluding a plurality of the heat conductive foil portions 121Y corresponds to the above-mentioned heat generating portion. If the above configuration is employed, the heating temperature in the vicinity where the heat conductive foil portions 121Y are provided can be uniformly lowered as compared with the heating temperature in the other regions. In this way, an arrangement configuration of the heat conductive foil portions 121Y makes it possible to control the temperature distribution by heating. Therefore, when the heating temperature required depending on the usage environment varies depending on the portion of the heater circuit portion 121, it is preferable to employ such a configuration.

In this example, the configurations other than the configuration of the heater circuit portion are the same as those in Example 1. Needless to say, the same effect as in Example 1 can be obtained also in this example.

An embodiment of the present disclosure may be a method for manufacturing a heater using the following first to fifth heaters and first to fourth flexible printed wiring boards.

A first heater is a heater using a flexible printed wiring board including a metal foil on one side of a base film, in which a heater circuit portion that generates heat when energized and a heat conductive foil portion provided at a position away from the heater circuit portion and maintained in a non-energized state are formed from the metal foil.

A second heater is a heater using a flexible printed wiring board including a metal foil on one side of a base film, in which a heater circuit portion including a heater wire is formed from the metal foil and a connecting portion that short-circuits adjacent portions of the heater wire is formed from the metal foil, so that a heat generating portion with a large amount of heat generated by energization and a heat conductive foil portion with a small amount of heat generated by energization but exhibiting a heat transfer function are provided in the heater circuit portion.

A third heater is the first or second heater, in which the heater circuit portion is configured such that the heater wire having a constant line width meanders at equal intervals.

A fourth heater is any one of the first to third heater, in which an energizing portion for energizing the heater circuit portion is formed from the metal foil.

A fifth heater is the fourth heater, and is characterized by including: a cover film that covers a surface of the metal foil; at least one electronic component provided on a front surface side of the cover film in a state where it can be electrically connected to the metal foil; and a connector provided in a state where it can be electrically connected to the energizing portion.

A method for manufacturing a first heater using a flexible printed wiring board, is characterized by including: an etching step of forming from a part of a metal foil a heater circuit portion that generates heat when energized and a heat conductive foil portion that is maintained in a non-energized state, by etching a material including the metal foil provided on one side of the base film; and a laminating step of providing a cover film covering a surface of the metal foil after the etching step.

A method for manufacturing a second heater using a flexible printed wiring board, is characterized by including: an etching step of forming from a part of a metal foil a heater circuit portion including a heater wire and a connecting portion that short-circuits adjacent portions of the heater wire, by etching a material including the metal foil provided on one side of the base film; and a laminating step of providing a cover film covering a surface of the metal foil after the etching step.

A method for manufacturing a third heater using a flexible printed wiring board is the method for manufacturing the first or second heater using the flexible printed wiring board, in which an energizing portion for energizing the heater circuit portion is formed from a part of the metal foil in the etching step.

A method for manufacturing a fourth heater using a flexible printed wiring board is the method for manufacturing the third heater using the flexible printed wiring board, and is characterized by including after the laminating step, a reflow step of providing by reflow soldering at least one electronic component provided on a front surface side of the cover film in a state where it can be electrically connected to the metal foil and a connector provided in a state where it can be electrically connected to the energizing portion.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A heater comprising:
a flexible printed wiring board including a base film and a metal foil provided on one side of the base film;
a heater circuit portion that is formed from the metal foil and generates heat when energized; and
a heat conductive foil portion that is formed from the metal foil at a position away from the heater circuit portion and is maintained in a non-energized state;
wherein the heater circuit portion includes a heater wire that meanders in repeating patterns arranged in several adjacent rows, each row comprising a plurality of the repeating patterns; and
wherein the heat conductive foil portion is disposed between the rows or between adjacent ones of the repeating patterns.

2. A heater comprising:
a flexible printed wiring board including a base film and a metal foil provided on one side of the base film;
a heater circuit portion including a continuous heater wire formed from the metal foil; and
a connecting portion that is formed from the metal foil and short-circuits adjacent portions of the continuous heater wire, wherein
the heater circuit portion comprises:
a heat generating portion with a large amount of heat generated by energization; and
a heat conductive foil portion with a small amount of heat generated by energization but exhibiting a heat transfer function; and
the heat conductive foil portion includes the connection portion.

3. The heater according to claim 1, wherein
the heater wire meanders at equal intervals and has a constant line width.

4. The heater according to claim 1, further comprising an energizing portion that is formed from the metal foil and energizes the heater circuit portion.

5. The heater according to claim 4, further comprising:
a cover film that covers a surface of the metal foil;
at least one electronic component provided on a front surface side of the cover film in a state where it can be electrically connected to the metal foil; and
a connector provided in a state where it can be electrically connected to the energizing portion.

6. The heater according to claim 2, wherein
the heater circuit portion includes a heater wire that meanders at equal intervals and has a constant line width.

7. The heater according to claim 2, further comprising an energizing portion that is formed from the metal foil and energizes the heater circuit portion.

8. The heater according to claim 7, further comprising:
a cover film that covers a surface of the metal foil;
at least one electronic component provided on a front surface side of the cover film in a state where it can be electrically connected to the metal foil; and
a connector provided in a state where it can be electrically connected to the energizing portion.

9. A method for manufacturing a heater including a flexible printed wiring board, comprising:
forming from a part of a metal foil a heater circuit portion that generates heat when energized and a heat conductive foil portion that is maintained in a non-energized state, by etching a material including a base film and the metal foil provided on one side of the base film; and
providing a cover film covering a surface of the metal foil after the etching;
wherein forming the heater circuit portion includes forming a heater wire that meanders in repeating patterns arranged in several adjacent rows, each row comprising a plurality of the repeating patterns; and
wherein forming the heat conductive foil portion includes forming the heat conductive foil portion between the rows or between adjacent ones of the repeating patterns.

10. A method for manufacturing a heater including a flexible printed wiring board, comprising:
forming from a part of a metal foil a heater circuit portion including a continuous heater wire and a connecting portion that short-circuits adjacent portions of the continuous heater wire, by etching a material including a base film and the metal foil provided on one side of the base film; and
providing a cover film covering a surface of the metal foil after the etching.

11. The method for manufacturing the heater including the flexible printed wiring board according to claim 9, wherein the etching includes forming an energizing portion for energizing the heater circuit portion from a part of the metal foil.

12. The method for manufacturing the heater including the flexible printed wiring board according to claim 11, further comprising
after providing the cover film,
providing by reflow soldering at least one electronic component provided on a front surface side of the cover film in a state where it can be electrically connected to the metal foil and a connector provided in a state where it can be electrically connected to the energizing portion.

13. The method for manufacturing the heater including the flexible printed wiring board according to claim 10, wherein the etching includes forming an energizing portion for energizing the heater circuit portion from a part of the metal foil.

14. The method for manufacturing the heater including the flexible printed wiring board according to claim 13, further comprising
after providing the cover film,
providing by reflow soldering at least one electronic component provided on a front surface side of the cover film in a state where it can be electrically connected to the metal foil and a connector provided in a state where it can be electrically connected to the energizing portion.

* * * * *